(12) United States Patent
Yamaguchi

(10) Patent No.: US 7,459,201 B2
(45) Date of Patent: Dec. 2, 2008

(54) COMPOUND FOR FORMING WIRING CONDUCTOR, FABRICATION METHOD OF CIRCUIT BOARD USING THE SAME AND CIRCUIT BOARD

(75) Inventor: Yoshihide Yamaguchi, Yokohama (JP)

(73) Assignee: Hitachi Cable, Ltd., Tokyo (JP)

( * ) Notice: Subject to any disclaimer, the term of this patent is extended or adjusted under 35 U.S.C. 154(b) by 132 days.

(21) Appl. No.: 11/008,243

(22) Filed: Dec. 10, 2004

(65) Prior Publication Data

US 2005/0207930 A1 Sep. 22, 2005

(30) Foreign Application Priority Data

Dec. 12, 2003 (JP) .............................. 2003-415557

(51) Int. Cl.
*B32B 3/00* (2006.01)
(52) U.S. Cl. ....................... 428/209; 174/250; 252/512; 216/13
(58) Field of Classification Search .................. 216/13; 428/209; 252/512; 174/250
See application file for complete search history.

(56) References Cited

U.S. PATENT DOCUMENTS

| | | | | |
|---|---|---|---|---|
| 4,751,126 | A | * | 6/1988 | Oodaira et al. .............. 428/139 |
| 5,332,869 | A | * | 7/1994 | Hagiwara .................... 174/257 |
| 5,698,015 | A | * | 12/1997 | Mohri et al. ................. 252/512 |
| 5,922,245 | A | * | 7/1999 | Mohri et al. ................. 252/512 |
| 7,081,214 | B2 | | 7/2006 | Matsuba et al. |
| 2001/0004477 | A1 | * | 6/2001 | Fukunaga et al. ............ 427/475 |
| 2005/0147917 | A1 | * | 7/2005 | Yamaguchi ............... 430/270.1 |
| 2005/0271931 | A1 | * | 12/2005 | Finnerty ...................... 429/44 |

FOREIGN PATENT DOCUMENTS

| | | |
|---|---|---|
| JP | 56-66089 | 6/1981 |
| JP | 08-242060 | 9/1996 |
| JP | 2001-167633 | 6/2001 |
| JP | 2002-299833 | 10/2002 |
| JP | 2003-195511 | 7/2003 |
| WO | WO 02/35554 | 5/2002 |

* cited by examiner

*Primary Examiner*—Shamim Ahmed
(74) *Attorney, Agent, or Firm*—Antonelli, Terry, Stout & Kraus, LLP.

(57) ABSTRACT

The present invention sufficiently secures conductor component content ratio in wiring formed on a multilayer circuit board and increases reliability by fabricating the multilayer circuit board by steps of drawing wiring precursor patterns containing a paste of compound for forming wiring conductor containing (a) superfine metal particles (metal nanoparticles) whose average particle size is 1-10 nm; (b) an organic coating compound coated on the surface of the superfine metal particle in the film thickness of 1-10 nm; (c) a latent reactive organic compound reacting with the organic coating compound in the range of 100-250° C., (d) metal particles whose average particle size is 0.5-10 μm, and (e) dispersion medium that stably disperses components (a) through (d) on a substrate by screen printing, sintering by heating the patterns to 100-250° C., and electrochemically treating the patterns to allow the conductor to deposit in a desired cross-sectional area in the inside.

9 Claims, 2 Drawing Sheets

⬇ Sintering

⬇ Electrochemical Treatment

Printing

Sintering

Electrochemical Treatment

COMPOUND FOR FORMING WIRING CONDUCTOR, FABRICATION METHOD OF CIRCUIT BOARD USING THE SAME AND CIRCUIT BOARD

CROSS-REFERENCE TO RELATED APPLICATION

The present application claims priority from Japanese Patent Application No. JP 2003-415557 filed on Dec. 12, 2003, the content of which is hereby incorporated by reference into this application.

TECHNICAL FIELD OF THE INVENTION

The present invention relates to a printed circuit board technology and more specifically, to a conducting compound for forming a circuit board at low cost and in a short time, a fabrication method of a circuit board with conductor patterns that can be formed at low cost and in a short time using the relevant conducting compound, and to the circuit board.

BACKGROUND OF THE INVENTION

As a multilayer circuit board fabrication method, a large variety of methods have been designed, and the methods can be classified from several points of view and used properly in accord with their characteristics.

For example, to classify the printed circuit board fabricating methods with focusing on the conductor portion, the methods can fall into two broad general categories: (1) subtractive method in which a conductor is formed on the whole surface and undesired conductor portions are removed by etching while only desired conductor portions leaving and (2) additive method in which conductor patterns are formed only on the desired portions by the use of method such as plating and others.

Recently, considerable high-density wiring has been required for circuit boards used for various electronic equipments, and even when either of the above-mentioned methods is used, it is general practice to form desired conductor patterns using photolithography. This is because fine patterns can be easily formed by the use of photolithography.

The circuit board fabrication technology using photolithography is briefly described as follows.

In the case of the subtractive method, first of all, a substrate with a conductor formed on the surface is prepared, and on the surface, a coating of photosensitive material (resist, e.g. photoresist) is formed. Thereafter, the resist is processed into a desired pattern by exposure and development, and using the pattern as a mask, the substrate surface conductors located at the pattern opening portions are selectively removed by etching, and finally, the desired conductor pattern is obtained by removing the resist.

On the other hand, by the additive method, the photosensitive material (resist) filmed on the substrate surface is processed into desired patterns by exposing and developing, and then, with the pattern used as a mask, a conductor is formed in accordance with the resist opening pattern by a method such as plating and others, and finally, the desired conductor pattern is obtained by removing the resist.

Whether the subtractive method is used or the additive method is used, the above-mentioned methods are characterized in that the photolithography technology using photosensitive S material is utilized. The use of the photolithography technology enables fine high-density circuit patterns to be comparatively easily formed only by preparing photo masks corresponding to the desired patterns.

However, because the above-mentioned conventional technologies utilize photolithography, the technologies have technical problems specific to photolithography as mentioned below.

(1) It takes long time to begin production after completion of designing circuit patterns:

Fabrication of the photo mask used in the photolithography technology can be started only after desired circuit patterns are designed using CAD (Computer Aided Design) and others and after the data is further converted into processing data of the photo mask fabrication apparatus (photo plotter). According to the fact that substrate fabrication cannot be started unless the photo mask is ready, a period from several days up to one week required to fabricate the photo mask after undergoing these complicated processes causes obstacles for shortening of the fabrication lead time.

(2) Photo masks must be fabricated in each time when the design is changed:

Even in the case of minor design changes such as modifying only part of the patterns, the photo mask must be completely newly fabricated, and the substrate fabrication must be suspended in the period each time until refabrication of the photo mask is completed, which generates vain wait time.

Because in analog signal processing circuits, unexpected malfunction is likely to occur due to noise from peripheral circuits, adjustments of patterns after product assembly (cut-and-try) are frequently carried out, and the process of re-fabricating the photo mask per such adjustments constitutes one of the reasons for prolonged period of developments.

(3) Photo masks must be redundantly fabricated for each fabricating site:

The pattern size on the photo mask is, in general, not exactly same as the pattern size on the design drawing but correction specific to a fabricating line is frequently made. Specifically, the pattern size and profile are corrected with performance and accuracy of various kinds of processing apparatus and equipment (for example, parallelism, wavelength, and aberration of light source in photolithography machine, in-plane distribution of film quality and, temperature distribution in film-forming apparatus, and others) taken into account.

Consequently, even when exactly same products (circuit boards) are manufactured, the photo mask cannot be accommodated among a plurality of fabricating sites, and in order to achieve shared production among sites, photo masks must be fabricated at every fabricating site, causing obstacles to flexible production adjustment.

On the other hand, presently, various information equipments including cellular phones, personal computers, and others are distributed to the public, and a tendency for one person to possess one (or more) of these information equipments is much more strongly developed, and a wide variety of functions and performance that support a wide variety of use environment and use condition of each individual have been required. To satisfy these diverse needs, the production system of "mass-producing single specification products" cannot accommodate, and a high-variety small-lot production and a fabricating system that can adjust the production amount and production sites in accord with demand fluctuation are desired.

In order to solve the problems (1) through (3) above, which constitute big obstacles to these market needs, a technology for selectively irradiate the desired portion only of the resist without using photo masks has been proposed and for example, as exemplified in Japanese Patent Application Laid- Open Publication No. 2003-195511 (and its corresponding U.S. Patent Application Publication US 2003/0124463A1), this is called a direct drawing technology, and is a technique to scan-irradiate the resist surface with a laser beam in place of using photo masks (first conventional technology).

Because in the first conventional technology, no photo mask is used, problems described in Paragraphs (1) through (3) can be solved. However, the laser scan apparatus used in this technology requires large-scale equipment with data processing apparatus to quickly process very large amounts of drawing data combined in addition to the laser light source and complicated optical system, and a new problem of high cost and large consumption energy is generated.

In the mean time, in Japanese Patent Application Laid-Open Publication No. 56-66089 and others, a technique to form resist patterns using an ink jet printing technique in place of photolithography represented by exposure and development of photosensitive material is proposed (second conventional technology). The feature of this technique lies in that chemical-resistant resin ink (resist) is directly drawn on a substrate, and a process for applying the resist to the whole surface and a process for removing resist at undesired portions are no longer required.

As a result, by (1) reduction of photoresist consumption amount, (2) non-use of developer, and (3) shortened fabricating time resulting from omission of processes, reduction of the consumption rate of harmful chemical substances can be achieved, too, in addition to the reduction of the fabricating cost. Because the ink jet printing apparatus requires no complicated optical system or no power supply for laser emission, as compared to the laser-scan apparatus used in the first conventional technology, comparatively lower cost and less power consumption can be achieved.

While ink bleed and instability of ink shape are likely to occur in the ink jet printing technology, a countermeasure technique to specify the surface roughness range of the substrate for such phenomena is proposed in Japanese Patent Application Laid-Open Publication No. 8-242060.

In Japanese Patent Application Laid-Open Publication No. 2002-299833, the second conventional technology is further advanced and a method for directly forming conductor patterns is proposed (third conventional technology). The feature of this technology lies in using a liquid-form paste containing superfine metal particles (nanoparticles) that can be sintered at 250° C. or lower and directly drawing desired circuit patterns on a substrate by printing and other methods. By this kind of feature, (1) there is no need to form conductors in advance on a substrate, (2) resist is not at all used, (3) etching and plating processes can be omitted, and other effects can be achieved.

In addition, in Japanese Patent Application Laid-Open Publication No. 2001-167633 (and its corresponding U.S. patent application Publication US 2001/0004477A1), as a measure to improve the conductivity, it is proposed to use a metallic component containing solution made of superfine compound metal particles uniformly dispersed in a medium, which particles consist of a core portion substantially composed of metallic component with whose average particle size ranging from 1 to 10 nm and a cover layer composed of an organic material chemically bonded to the core portion, because there exists a certain limit to the conductivity after film is formed with use of the metal paste with conventionally used metal powders and resin or glass components dispersed in an organic medium in forming a conductive metal thin film on the semiconductor substrate by the immersion method, spray applying method, and other thin-film forming method.

SUMMARY OF THE INVENTION

When fine wiring is formed by the use of the second conventional technology, low-viscosity ink is used to discharge (eject) superfine ink drops accurately by ink-jet printing, and as a result, there is a problem of ink bleed and instability of ink shape when resist patterns of film thickness that can stand the plating process or etching process are formed.

To solve this problem, in Japanese Patent Application Laid-Open Publication No. 8-242060, a technique to restrict the surface roughness range of the substrate (conductor) is proposed. However, because the conductor surface roughness greatly affects adhesion of resist, restricting to the surface roughness range cannot secure resist adhesion, and generates exfoliation or crack of resist in the process of being plating or etching, and as a result, it is likely to cause such a problem that the desired patterns are unable to be obtained.

In addition, because superfine accurate shaping of ink discharge port (i.e. ink jet nozzle) is essential to accurately discharge superfine ink droplets by ink jet printing, it is difficult to obtain the ink discharge port. Furthermore, in order to efficiently form resist film in a wide area by superfine ink droplets, it is desirable to arrange a large number of highly accurate ink discharge ports in a line, but the inkjet printer that has such a large number of juxtaposed highly accurate ink discharge ports inevitably costs high, and the printer can not solve the problem of the first conventional technology concerning the apparatus price. Conversely, a great deal of troublesome work is required to maintain the highly accurate ink discharge ports, possibly creating a new problem.

On the other hand, in the third conventional technology, resist is not inherently used and no adhesion problem between the substrate and resist occurs, but a new problem arises from printing liquid paste containing superfine particles.

That is, the first problem lies in the point that the conductor thickness obtained by one film-forming processing is small because the volume which the conductor dispersed in the liquid-form paste occupies is small.

As set forth in the above Japanese Patent Application Laid-Open Publication No. 2002-299833, the liquid-form paste used in the third conventional technology contains superfine conductor precursor particles, and these particles have double construction with the surface of the superfine conductor particle covered with the coating material in order to prevent aggregation of these particles. In the Japanese Patent Application Laid-Open Publication No. 2002-299833, the film thickness of the coating material is not specifically disclosed but the description content of Comparative Examples 1 and 2 suggests that the coating material film must secure the thickness not smaller than the monomolecular layer in order to allow aggregation prevention function to be obtained. Based on this, it is supposed that the film thickness of the coating material would be at least about 1 nm and about 2 nm on average.

Assuming that the conductor precursor particle has a construction that has a 2-nm-thick coating layer on the surface of 7-nm-diameter superfine conductor particle, it can be calculated that the volume of the superfine conductor portion is about 20% of the whole superfine conductor precursor particle. The liquid-form paste has a composition in which superfine conductor precursor particles are stably dispersed in the liquid and consequently, it is certain that the percentage (volume ratio) of the conductor in the liquid-form paste is greatly less than 20%, and even if the conductor patterns are formed by directly print-drawing, the volume (thickness) that can be actually used as a conductor has to be small. As a result, in general, multiple times of recoating are required to form wiring patterns of desired film thickness.

Providing multiple times of recoating gives rise to problems including (1) more processing time required; (2) occurring of misalignment in superimposing; and (3) loss of adhesion between superimposed layers.

The second problem inherent to the third conventional technology is sintering shrinkage.

The paste used in the third conventional technology contains superfine conductor precursor particles with the surface covered with coating material, but at the time when the film is formed by a method such as printing, these superfine conductor precursor particles do not come in contact with one another or even if they are in contact, the superfine conductor precursor particles are separated by the surface coating film and the superfine conductor particles are not conductive as they are.

According to the technology proposed in Japanese Patent Application Laid-Open Publication No. 2002-299833, heating the superfine conductor precursor particles to about 250° C. after film-forming by printing generates reactions to remove the coating material, and as a result, the conductor precursor particles come in contact and aggregate so as to obtain conductivity. In the process of this reaction, as specified in Abstract, FIG. 1(c) and other multiple places of the Japanese Patent Application Laid-Open Publication No. 2002-299833, shrinkage is essential for securing electrical continuity. As explained with reference to the first problem above, considering that the volume of the conducting portion of the superfine conductor precursor particles is small, it is assumed that the shrinkage would occur at a considerably large shrinkage ratio, and the phenomenon has been confirmed by additional tests conducted by the inventor of the present application.

Because the pattern shape just after paste printing and the pattern shape after sintering greatly differ when the shrinkage ratio is large, it cannot be expected to particularly have the desired wiring shape and cross-sectional shape. In addition, by shrinkage, stress is induced inside the wiring pattern, causing stress corrosion, migration, or wiring disconnection, or possibly causing defective adhesion between the substrate and the pattern.

In the meantime, the present inventor found out that in the structure after sintering, a void (a cavity) nearly equivalent to the occupied volume of the dispersed medium removed when sintering should have been generated inside the sintered structure. In the wiring conductor with such void structure incorporated, needless to say, cracks are generated when any external force and other stress is applied to such a void, and at worst, the case in which breakage of a wiring conductor may result cannot be denied. Today, still thinner and more flexible circuit boards are required so as to be freely bent, and measures to secure sufficient strength against various external forces such as bend stress exerted to conductor wiring are essential techniques. However, in conventional technologies, nothing is indicated about recognition of such problems concerning the void in the wiring conductor portion after sintering, and the present inventor thought it urgent to take some kinds of technological measures in such point.

It is an object of the present invention to solve the problem of the third conventional technology.

Specifically, it is the first object of the present invention to provide a conductor paste which comprises a new composition and can be sintered at low temperature and which can solve the first problem (low conductor occupying ratio) in the third conventional technology.

It is the second object of the present invention to provide a technique for fabricating wiring or circuit boards at low cost and in a short time by a direct drawing technique using the low-temperature sintering conductor paste with high conductor occupying ratio.

The third object of the present invention is to provide a low-cost circuit board which can be fabricated in a short delivery period by the direct drawing technique.

The fourth object of the present invention is to solve the strength problem based on a void formed at the wiring conductor portion after sintering.

In order to achieve the above-mentioned objects, the present inventor has designed the composition (composition thereof) of the conductor precursor for circuit boards, which have both advantages of the second and the third conventional technologies, and furthermore, designed a method of fabricating circuit boards at low cost and with short lead time by the use of the conductor precursor, and achieved the present invention.

The characteristics of the technique (technological means) are described as follows.

The compound for forming wiring conductor according to the present invention is a compound for forming the wiring conductor that forms drawing patterns to be converted into the wiring conductor by sintering, and comprises a paste that contains (a) superfine metal particles whose average particle size is 1 through 10 nm; (b) an organic coating Compound coated on the surface of the superfine metal particle in the film thickness of 1 through 10 nm; (c) a latent reactive organic compound that reacts with the organic coating compound in the range from 100 to 250° C., (d) metal particles whose average particle size is 0.5 through 10 µm, and (e) dispersion medium whose solubility parameter to disperse components (a) through (d) ranges from 2.5 to 7.0.

The fabrication method of circuit boards according to the present invention comprises steps of (a) preparing paste containing superfine metal particles whose average particle size is 1 through 10 nm, an organic coating compound coated on the surface of the superfine metal particle in the film thickness of 1 through 10 nm, a latent reactive organic compound that reacts with the organic coating compound in the range from 100 to 250° C., metal particles whose average particle size is 0.5 through 10 µm, and dispersion medium which can stably disperse these components; (b) directly drawing patterns to be wiring precursor on a substrate with the paste through screen printing mask having desired opening patterns; (c) sintering the wiring precursor by heating the substrate to 100 to 250° C., and (d) electrochemically treating the sintered wiring precursor to have a desired conductor cross-sectional area. The screen printing mask is the mask that matches the finest fine-line pattern in the wiring portion of the circuit board, and the wiring portion with the line width bigger than the fine-line pattern is formed by increasing the conductor cross-sectional area to the desired film thickness by the electrochemical treatment. The electrochemical treatment is characterized by the plating treatment provided for the wiring precursor.

In addition, the fabrication method of circuit boards according to the present invention comprises steps of drawing patterns for wiring on a substrate using a compound for forming wiring conductor with varying metal particles of average particle sizes dispersed in a dispersion medium, sintering the drawn patterns, and filling voids after getting rid of the dispersion medium in the drawn patterns after sintering with the conductor to form a wiring conductor. The compound for forming wiring conductor according to the present invention is a paste that contains (a) superfine metal particles whose average particle size is 1 through 10 nm; (b) an organic coating compound coated on the surface of the superfine metal particle in the film thickness of 1 through 10 nm; (c) a latent reactive organic compound that reacts with the organic coating compound in the range from 100 to 250° C., (d) metal particles whose average particle size is 0.5 through 10 μm, and (e) dispersion medium that disperses components (a) through (d). The filling of conductor is performed by plating the drawn patterns after sintering with conductor metal.

The circuit board according to the present invention comprises a wiring conductor with conductors filled after forming the sintered structure disposed between metal particles of the sintered structure, in which the metal particles of 0.5-10 μm average particle sizes are bonded to metal particles, and the metal nanoparticles. The sintered structure is characterized by being formed by sintering wiring patterns formed by using a compound for forming wiring conductor containing (a) superfine metal particles whose average particle size is 1 through 10 nm; (b) an organic coating compound coated on the surface of the superfine metal particle in the film thickness of 1 through 10 nm; (c) a latent reactive organic compound that reacts with the organic coating compound in the range from 100 to 250° C., (d) metal particles whose average particle size is 0.5 through 10 μm, and (e) dispersion medium that disperses components (a) through (d). The filling of conductor is performed by filling conducting metal by plating treatment between the metal particles and the metal nanoparticles after forming the sintered structure.

In addition, the circuit board according to the present invention is characterized by comprising wiring layers wherein either one of or both of the following conductors are used; the conductor having (a) a particulate metal region of average particle size ranging from 0.5 to 10 μm and (b) a metal layer of 2-50 nm film thickness that exists between the metal regions set forth in the (a), and the conductor having (c) a particulate meta region of average particle size of 0.5 μm, (d) a 2-50 nm metal layer that exists between the metal regions set forth in the (c), and (e) a matrix metal layer that surrounds the metal region set forth in the (c) and the metal layer set forth in the (d).

Meanwhile, the particulate metal region referred to here corresponds to, for example, metal particles. In addition, the metal layer that exists between metal regions means the state in which the metal layer stands between metal regions, whether or not the metal layer bonds between metal regions.

To be more specific, a preferable particulate metal region is of a region with particles of a nearly spherical form, which have an average particle size of at least one kind of value chosen from the range between 0.5 and 10 μm, and it is justified in having multiple kinds of particulate metal region of varying average particle sizes as required. To cite one example of combinations of sizes of multiple kinds of particulate metal regions, they are three kinds of average particle size of 0.8 μm, average particle size of 2 μm, and average particle size of 5 μm, and by properly dispersing these three kinds of particulate metal regions throughout the whole conductor, the conductivity uniformity can be achieved.

In addition, in order to maintain the positional relationship between particulate metal regions, a metal layer (inter-region metal layer) comprising 2-50 nm film thickness is disposed between particulate metal regions. Such inter-region metal layer may be located on the surface of the particulate metal regions or part of it may be mutually diffused at the interface with the particulate metal regions. In addition, the interfacial portion between the particulate metal region and the inter-region metal layer may be an intermetallic compound.

In addition to the inter-region metallic layer disposed between the particulate metal region and the particulate metal region, it is still more preferable to dispose another metal layer (matrix metal layer) in such a manner as to further surround both. By achieving this kind of arrangement, such another metal layer becomes a matrix metal layer as viewed from the particulate metal region and inter-region metal layer and can achieve reduction of resistivity and improved strength as a conductor.

In order to form the matrix metal layer, it is desirable to use an electrochemical means. Specifically, methods such as plating and others are preferably used. By using plating, the matrix metal layer can be definitely and inexpensively formed. Needless to say, in order to form the matrix metal layer without departing from the spirit and scope of the present invention, it is allowable to use the plating method in combination with other publicly known conventional methods.

The following effects can be achieved by the technology proposed by the present invention.

(1) Because wiring patterns are directly formed on a substrate by direct film forming of conductor patterns, wiring can be fabricated in a short time and at low cost, and the consumption of resist and the developer and other secondary material can be reduced, and the amount of capital investment such as a photo lithography machine and development apparatus can be minimized.

(2) Because the paste component contains a large percentage of conductor (volume), wiring of a desired film thickness can be formed by one film forming.

(3) Because the conductor content (volume) of paste component is large and pattern deformation caused by sinter-shrinkage is suppressed, wiring with the desired cross-sectional profile can be easily formed. Furthermore, as a result of the stress inside wiring generated in the process to give conductivity to wiring being suppressed to minimum, no wiring corrosion, migration, wiring breakage, and others arising from stress occur.

(4) Because the conductor content (volume) of paste component is large and pattern deformation caused by sinter-shrinkage is suppressed, degraded adhesion at the interface between substrate and wiring does not occur.

(5) By providing electrochemical treatment such as plating, etc. after sintering, the void formed by removal of dispersed medium during sintering is filled with the conductor, so that the electrical resistance formed at the wiring conductor portion can be reduced as compared to the case with no filling treatment provided for the void as well as strength can be improved.

BRIEF DESCRIPTIONS OF THE DRAWINGS

DESCRIPTION OF THE PREFERRED EMBODIMENTS

Figure 1A:
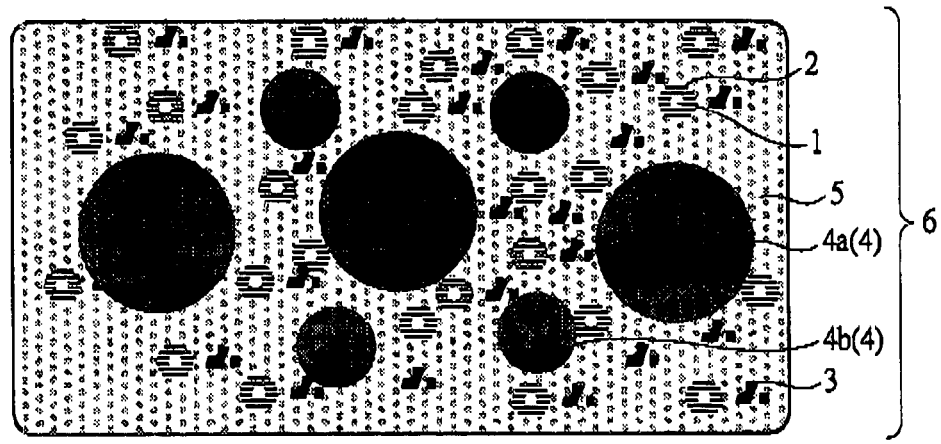
FIG. 1A is a conceptual schematic drawing that outlines the compound for forming wiring conductor according to the present invention.
Figure 1B:
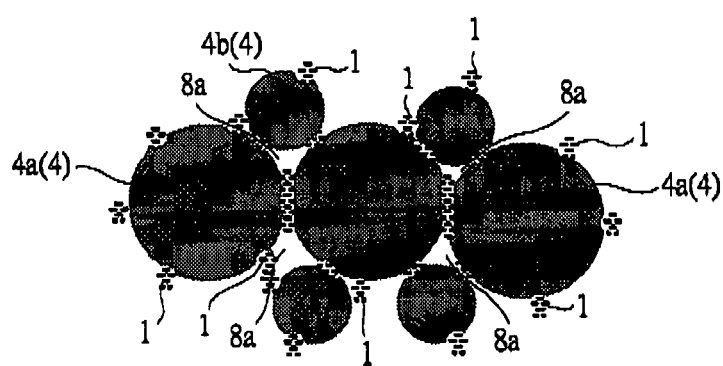
FIG. 1B is a conceptual drawing that schematically represents the metallic bond state after sintering the wiring conductor portion using the compound for forming the wiring conductor.
Figure 1C:
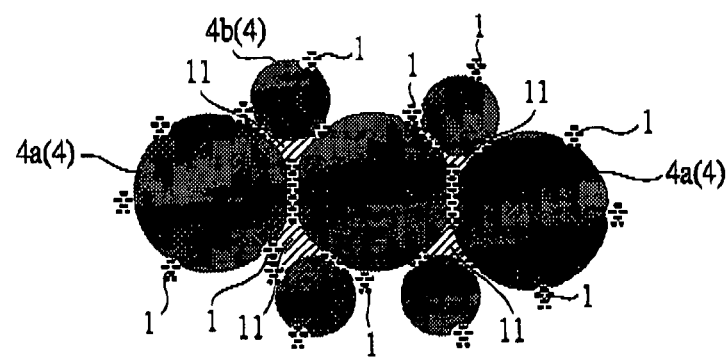
FIG. 1C is a conceptual drawing that schematically represents the condition in which deposition of conductive material in voids is carried out by plating treatment in voids inside the wiring conductor.

Referring now to drawings, the best mode for carrying out the invention will be described in detail as follows. FIG. 1A is a conceptual schematic drawing that outlines the compound for forming wiring conductor according to the present invention; FIG. 1B is a conceptual drawing that schematically represents the metallic bond state after sintering the wiring conductor portion using the compound for forming the wiring conductor; and FIG. 1C is a conceptual drawing that schematically represents the condition in which deposition of conductive material in voids is carried out by plating treatment in voids inside the wiring conductor. FIG. 2A through 2D are schematic representations that explain the fabrication method of a circuit board according to the present invention along the procedure.

Embodiment 1

First of all, in embodiment 1, a compound (and a composition thereof) for forming wiring conductor, one of the technologies proposed by the present invention, will be described.

As shown in FIG. 1A, compound for forming wiring conductor 6 related to the present invention contains:
(a) superfine metal particles (metal nanoparticles) 1 whose average particle size is 1 through 10 nm;
(b) an organic coating compound 2 coated on the surface of the superfine metal particle 1 in the film thickness of 1 through 10 nm;
(c) a latent reactive organic compound 3 that reacts with the organic coating compound in the range from 100 to 250° C.;
(d) metal particles 4 whose average particle size is 0.5 through 10 μm; and
(e) dispersion medium 5 that stably disperses components (a) through (d).

The superfine metal particles 1 suited for the present invention are so-called metal nanoparticles of average particle size between 1 and 10 nm. For this metal nanoparticle, publicly known conventional metal nanoparticle can be used, and, specifically, gold, silver, copper, platinum, palladium, tin, lead, nickel, and others can be used, but from the viewpoint of using as a wiring conductor, nanoparticles of metals which are used for publicly known conventional wiring conductors are recommended. Among them, in order to definitely achieve bonding between metallic particles later discussed, as superfine metal particles 1, it is preferable to use metal nanoparticles nobler than the oxidation-reduction potential of hydrogen, that is, noble metals (gold, silver, platinum, palladium, and others), and it is more suitable to use nanoparticles of silver from the viewpoint of unit price of material.

When the average particle size of metal nanoparticles is lower than 1 nm, it becomes difficult to obtain the material, and conversely, when the average particle size exceeds 10 nm, the later discussed nanosize effect becomes difficult to be achieved due to this. Based on these viewpoints, it is preferable to set the average particle size of the superfine metal particles 1 used for the compound for forming wiring conductor 6 according to the present invention to the range not less than 1 nm and not more than 10 nm.

In order to prevent the superfine metal particles 1 from being aggregated one another, the organic coating compound 2 is allowed to adhere to the surface in advance. If the surface of the superfine metal particles 1 is not covered with such organic compound, the superfine metal particles 1 collide one another by thermal motion (Brownian motion) in dispersion medium 5, and by this, multiple superfine metal particles 1 coagulate. In the present invention, in order to prevent aggregation of this superfine metal particle, the surface of individual superfine metal particle 1 is covered with a layer that forms a so-called "cushion." The layer functioning as a cushion is formed by an organic compound 2 having properties to spread in a form of layer throughout the surface of the superfine metal particle 1, that is, "organic coating compound" in order to suppress aggregation even by any collisions between superfine metal particles 1.

In the present invention, the film thickness of the organic coating compound 2 that coats the surface of the superfine metal particle 1 is preferably between 1 and 10 nm. As set forth in Japanese Patent Application Laid-Open Publication No. 2002-299833, it is known that the aggregation prevention effect lacks when the film thickness is short for the specified film thickness, the lower limit of the most suitable film thickness is set to 1 nm in the present invention. In addition, in the present invention, since the coated film is allowed to spontaneously form on the surface of the superfine metal particle 1 through the self-assemble mechanism of the organic coating compound 2, the upper limit of the practical film thickness that can be formed by the mechanism is the most suitable film thickness of the present invention. That is, it is preferable to set the film thickness of the coated organic compound 2 that adheres to the surface of the superfine metal particle 1 to a range between not less than 1 nm and not more than 10 nm. Meanwhile, the particles which are coated by the organic coating compound 2 of 1-10 nm thickness are nanoparticles whose particle size is between 3 and 30 nm.

In the present invention, it is preferable to provide the organic coating compound 2 with coordination to the above metals so that the coated film comprising the organic coating compound 2 does not come off from the surface of the superfine metal particles 1 while the compound for forming wiring conductor 6 is stored. By coordinate-bonding the organic compound 2 to the metal atoms forming the superfine metal particles 1, the layer of the organic compound 2 spreads over the surface of the superfine metal particles 1 and becomes difficult to come off. In the present invention, publicly known conventional coordination compounds can be used as the organic coating compound 2, and this organic coating compound 2 is preferably Lewis base (electron donor) which has non-bonding electron pairs. The coordinate bond of organic compounds with Lewis base to metal atoms depends on the acidity and hardness of acid of the metal atom as Lewis acid (electron acceptor) and on the transfer speed of the organic compound. For specific examples of such organic coating compound, primary or secondary amines (including polyamine), polyether, and others are suitably shown for coordinate-bonding to metals.

More detailed examples of typical compounds of the organic coating compound include diisopropylamaine and trioxane. However, these substances are merely exemplified as substances which can be used as the organic coating compound in the present invention, and needless to say, it is no need to limit the organic coating compound to such substances.

In the present invention, while the organic coating compound 2 is allowed to spontaneously aggregate (self-assemble) on the surface of the superfine metal particles 1, reactions of organic coating compound to self-assemble on the surface of superfine metal particles 1 and reactions of superfine metal particles 1 to coagulate and aggregate competitively occur. Because the nanosize effect later discussed is lost when superfine metal particles 1 coagulate and aggregate, it is preferable to use the organic coating compound 2 with a large self-assemble reaction speed.

The present inventor found out that the speed of self-assemble reaction of the organic coating compound 2 is greatly influenced to the mass transfer in the liquid in which the compound is dispersed (for example, dispersion medium 5), and chose the Lewis base which provides a large transfer speed in the dispersion medium 5 later discussed as the organic coating element. Or, the compound for forming wiring conductor 6 may be mixed and prepared under the conditions to accelerate the transfer speed of the organic coating element. By the way, it is needless to point out again that the self-assemble speed of the organic coating compound 2 is not determined only by the transfer speed of the medium and the transfer speed in the medium is determined by various factors.

The organic coating compound 2 suited for the present invention is the Lewis base which has the donation number, which is an index of the intensity of interaction with the dispersion medium 5, between 0 and 14 and the molecular weight between 50 and 2000, with the availability taken into account.

Meanwhile, because the hardness of acid varies in accordance with the kind of metal, particle size, and others of the superfine metal particles 1, the Lewis base having hardness corresponding to the hardness of acid of superfine metal particles 1 should be preferably used as the organic coating compound 2, and a compound in which the basicity and nucleophilicity are well-balanced should be most suitably used.

By these innovations, the organic coating compound 2 forms a stable coating film on the surface of superfine metal particles 1 and this coating film does not come off from the surface of the superfine metal particles 1 while the compound for forming wiring conductor 6 is stored at low temperature. However, because, forming a wiring conductor from this compound for forming wiring conductor 6, the coating film must be peeled and superfine metal particles 1 must be coagulated and aggregated, in the present invention, a compound (latent reactive organic compound 3) which has a latent ability to react with the organic coating compound 2 that forms the coating film is mixed in the compound for forming wiring conductor 6.

The latent reactive organic compound 3 is chosen from publicly know conventional substances which react with the organic coating compound 2, but a substance which exhibits the "latent reactivity" that does not react during storage but begins reactions when a specific external stimulus is given is preferable.

Specific examples include (1) substances which are solid at room temperature and scarcely reactive but manifest reactivity due to dissolution thereof to medium or melting thereof by application heat thereto; (2) substances which give rise to decomposition or rearrangement reactions and obtain a reactive functional group when they are heated to a specified temperature or higher; (3) substances which cause decomposition or rearrangement reactions and obtain a reactive functional group by optical stimulus of specific wavelength, and others.

In the present invention, with convenience of facilities and process in circuit board fabrication process taken into account, the heating treatment of the compound for forming wiring conductor 6 is judged the best suited as the "specific external stimulus," and the latent reactive organic compound 3 which actualizes the reactivity or acquires reactivity by heating treatment at 100-250° C. is used.

Examples of the latent reactive organic compound 3 suited for the present invention include tetraethylammonium-tetrafluoroborate, triphenylphosphine, and others, but these substances are absolutely shown as examples and needless to say, the latent reactive organic compound 3 should not be limited to these substances.

Meanwhile, it is allowable to add a latency supplementing component to the compound for forming wiring conductor 6 as required in order to assist or augment the latency. For example, substances which decompose by heat and light and generate acid or base may be added. Specific examples include ammonium salts which generate acid by Hofmann decomposition by heat and sulfonium salts which generate acid by photodecomposition, and in the present invention, it is desirable to add these supplementary components in a range that would not interfere with the stable dispersibility of the compound for forming wiring conductor 6.

The latent reactive organic compound 3 of the present invention undergoes nucleophilic reactions from the nucleophilic substituent group of organic coating compound 2. Consequently, with regard to suitable organic coating compound 2 and latent reactive organic compound 3 in the present invention, it is preferable to appropriately choose combinations suited for intended use with the reactivity of them taken into account.

The most suitable combination in the present invention is the combination of strong basic organic coating compound 2 with weak nucelophilicity and weak acidic latent reactive organic compound 3 with weak or medium electrophilicity.

In order to increase the conductor content of the compound for forming wiring conductor 6 and reduce the sintering shrinkage in the process for giving conductivity, metal particles 4 of 0.5-10 μm average particle sizes are used in the present invention.

The content of metal particles 4 in the compound for forming wiring conductor 6 is determined with the pattern formability later discussed taken into account, but it is preferably between 30 and 90% by volume. If it is greatly lower than 30% by volume, the sinter-shrinkage rate increases and repeated film formation is required or a problem of generating internal stress in the wiring conductor occurs, and conversely, when the content exceeds 90% by volume, the pattern formability is reduced.

When particulate materials are mixed, a face-centered cubic lattice model is frequently used as a mathematical model for estimating the maximum value of the mixture rate (volume). According to this model, when a cubic is filled with spheres of uniform diameter, the upper limit of the filling rate is only less than 70% at most. In the present invention, there are cases in which a liquid paste which is filled more than 70% is used as required, and in order to achieve 70% or more filling rate, it is preferable to mix and use several kinds of powders with average particle sizes between 0.5 and 10 μm.

Because it is extremely difficult to selectively fabricate particles of particle size distribution not more than 0.5 μm of average particle sizes only, or it is not easy to selectively accumulate particles of particle size distribution under the 0.5 μm of the average particle sizes by classification, it is not practical to use particles of particle size distribution not more than 0.5 μm of average particle sizes for the paste composition. In addition, when the particle size exceeds 10 μm, it becomes difficult to secure the 70% or more filling rate. Therefore, it is preferable to set the average particle size of metal particles 4 to the range not less than 0.5 μm and not more than 10 μm.

To mention one example of the most preferable composition of metal particles 4 in the present invention, it is a composition with three kinds of powders with average particle sizes 0.8 μm, 2 μm, and 5 μm mixed. The typical example of the mixture ratio is 2 equivalent volume of metal particles of 0.8 μm average particle size by volume, 1 equivalent volume of metal particles of 2 μm average particle size by volume, and 0.5 equivalent volume of metal particles of 5 μm average particle size by volume. Naturally, it is allowable in properly to adjust the mixture ratio and particle size distribution with the availability and convenience of preparing the composition as well as pattern formability taken into account and further in accordance with the intended use and applications.

By the way, FIG. 1A schematically shows the case when large-particle size metal particles 4a (4) and small-particle size metal particles 4b (4) are mixed as an example of mixture composition of such metal particles 4.

The metal particles 4 used in the present invention is preferably copper particles with conductivity, ease of availability, price, migration resistance, and ease of processing taken into account. Needless to say, it is allowable to perform alloying for the purpose of oxidation prevention, or providing metal coating to the surface for preventing oxidation. Examples of metal films formed on the surface include gold, palladium, and others, but gold is suited in view of electric resistance and price.

For the compound for forming wiring conductor 6 of the present invention, a dispersion medium 5 is used in order to stably disperse the four components of superfine metal particles 1, organic coating compound 2, latent reactive organic compound 3, and metal particle 4. For the dispersion medium 5, publicly known conventional organic medium can be used, but a medium which secures stable dispersibility with superfine metal particles 1 and metal particles 4 after achieving suitable reactivity between organic coating compound 2 and latent reactive organic compound 3 is preferable.

From the viewpoint of achieving appropriate reactivity, the dispersion medium 5 preferably possesses specific physicochemical properties. Examples of the suitable specific physicochemical properties in the present invention include solubility parameter, viscosity, surface tension, dielectric constant, and others. According to experiments of the present inventor, the specific value of solubility parameter δ of the dispersion medium 5 suited for the present invention was between 2.5 and 7.0. Meanwhile, needless to say, several kinds of medium can be used in combination or even a medium that exceeds the above-mentioned solubility parameter may not always be used depending on the property values of viscosity, dielectric constant, and others.

In the present invention, for the solubility parameter of the medium, a numerical value which can be obtained by the publicly known conventional calculation formula, that is, by dividing the evaporation enthalpy ΔH of the liquid molecule by molecular weight and then raising the quotient to the ½ power, is used.

The paste composition of the present invention contains superfine metal particles 1 which combine a hydrophobic property by coating the surface with the organic coating compound 2 and metal particles 4 which have no organic coating compound 2 on the surface. In order to stably disperse both, the present inventor was dedicated to searching the dispersion medium and found that one of the key properties for stable dispersion is the polarity of the dispersion medium.

When the present inventor investigated the dispersion stability with the solubility parameter used as an index, the present inventor confirmed that a paste comparatively stably dispersed is likely to be obtained if the solubility parameter δ is between 2.5 and 7.0 as described above.

Meanwhile, because as self-apparent from the calculation formula, the solubility parameter is an index that shows the extent of polarity per unit volume of the solvent, it is assumed that hydrophobicity excessively increases as the solubility parameter becomes smaller than 2.5 and superfine metal particles 1 which provide partially hydrophobicity is likely to aggregate.

Embodiment 2

In the embodiment 2, a circuit board for which the wiring conductor fabricated by the use of the compound for forming wiring conductor related to the present invention described in the embodiment 1 is used and the wiring conductor is at least partially used and fabrication method thereof will be described.

By using the compound for forming wiring conductor 6 proposed by the present invention, the wiring conductor can be conveniently formed, and by using this wiring conductor at least for part of it, a circuit board can be fabricated at low cost and in a short time.

Figure 2A:
FIG. 2A through 2D are schematic representations that explain the fabrication method of a circuit board according to the present invention along the procedure.
Figure 2B:
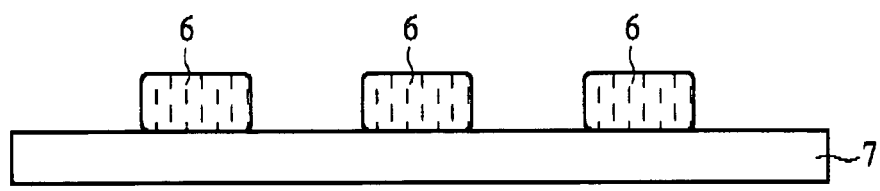
Figure 2C:
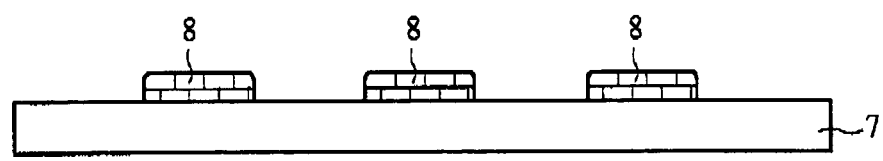

FIG. 2A shows a substrate 7 that serves as a base of the circuit board. As shown in FIG. 2B, on the surface of the substrate 7, the compound for forming wiring conductor 6 is formed into film to have a desired pattern shape. Thereafter, as shown in FIG. 2C, by heating treatment the substrate in such a manner that the pattern portion is sintered, a wiring conductor 8 with the desired pattern can be obtained. Operations of FIG. 2B and FIG. 2C may be repeated until the desired film thickness is obtained or the film thickness may be adjusted in combination with the void filling treatment (later discussed). In this way, as shown in FIG. 2D, a circuit board 10 with a wiring 9 comprising the wiring conductor 8 installed on the substrate 7 can be fabricated.

Figure 2D:
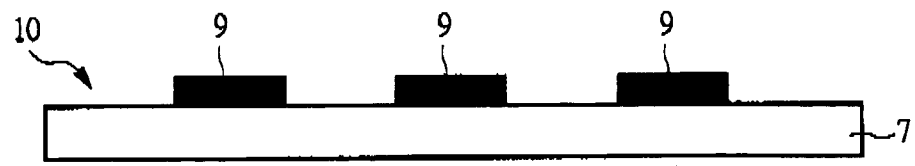

Referring now to FIG. 2B through FIG. 2D, each operation will be described in detail as follows.

FIG. 2B is a pattern-form film forming process of the compound for forming wiring conductor 6. In the present invention, for pattern forming of the compound for forming wiring conductor 6, a photolithography technique is not used but printing technique is used. In the present invention, it is possible to form patterns by the use of publicly known conventional printing technique but so-called screen printing is suitable, and stencil printing is more suitable.

In the present invention, publicly known conventional printing mask can be used, but when fine patterns are formed, particular care is required for the condition of the printing mask opening portion. Because the transfer rate of the paste comprising the compound for forming wiring conductor 6 is subject to a gauze exposed to the mask opening portion, a metal mask with no gauze exposed at the opening portion is desirable, if possible. It is not necessary to point out but at the time of installing a metal mask to the mask frame, a so-called combination mask with a gauze portion installed around the metal mask may be used.

FIG. 2C is a sintering process of the compound for forming wiring conductor 6 which has the desired pattern shape. In the present invention, by heating the compound for forming wiring conductor 6 with the pattern form and the substrate 7 at 100-250° C., the compound for forming wiring conductor 6 is sintered. As required, a method for selectively heating the pattern portion only may be adopted without any particular problem. For example, there is a method for directly spot-heating by laser and others.

In such sintering process, the superfine metal particles 1 (metal nanoparticles) melt by their nanosize effect as well as by the reactions between the organic coating compound 2 and the latent reactive organic compound 3, a reaction to remove the organic coating compound 2 from the surface of the superfine metal particles 1 takes place. Furthermore, superfine metal particles 1 in the molten state react with metal particles 4 present in the vicinity and bond metal particles 4. In such event, superfine metal particles 1 diffuse into metal particles 4 or metal particles 4 mutually diffuse to secure metallic bonds.

By this, the low-resistant and high-reliability electric continuity is achieved. By sintering in this way, metallic bond is formed at the wiring 9 portion comprising the wiring conductor (same as wiring conducting substance) 8 formed by the use of compound for forming wiring conductor 6 according to the present invention, and such metallic bond state is schematically shown in FIG. 1B.

By the way, in this stage, as shown in FIG. 1B, marks from which the dispersion medium 5 is evaporated may remain as voids 8a in the wiring conductor 8. The wiring conductor 8 of this kind of structure provides the mechanical strength inferior to the structure with the inside completely filled, and the volume resistivity is large but it is advantageous for reducing apparatus weight in terms of small bulk specific gravity.

In the present invention, treatment for filling voids 8a is carried out as required in response to the applications of the apparatus in which the circuit board 10 is used.

As the treatment to fill voids 8a, it is desirable to utilize the plating technique in the present invention. That is, by electroplating or chemical plating treatment, conductor 11 is allowed to deposit and fill voids 8a of the wiring conductor 8. FIG. 1C schematically shows the condition how the conductor 11 (indicated by diagonal lines in FIG. 1C) deposits and fills in voids 8a by plating treatment.

Because the film thickness or line width of the wiring conductor 8 may be varied when the conductor 11 is allowed to deposit in voids 8a by plating treatment, in the pattern forming process of FIG. 2B, it is essential to use a mask with a shape with such variation incorporated in advance. By further adding publicly known conventional electrochemical treatment, for example, trimming and other treatment by etching as required, the wiring conductor 8 with the desired cross-sectional profile can be formed.

For example, patterns thicker than the target fine-line patterns as a whole are directly drawn, and after sintering, the whole is etched to uniformly reduce the line width. It is difficult to form a mask with fine lines and such mask with fine line width has short life, but by carrying out this kind of treatment in the present invention, problems in using a mask with fine-line width with short life can be avoided.

Furthermore, when treatment to fill voids 8a with the conductor is not carried out, in the direct drawing process of paste, lines must be drawn with large film thickness with the shrinkage rate incorporated after sintering in advance. However, from the printing mask fabricating technique, the printing mask of fine patterns must be inevitably reduced in thickness, and as a result, the pattern of the printing mask can not but be limited in the thickness thereof corresponding to a portion thereof having the smallest wiring width. Consequently, it is practically difficult to directly draw patterns in a large film thickness with the shrinkage rate after sintering anticipated from the beginning for the whole wiring portion.

However, in the configuration to fill voids 8a with the conductor 11 after sintering as is the case of the present invention, for example, forming the whole wiring with the thin pattern by drawing directly a pattern using a thin printing mask that corresponds to the thinnest fine-line pattern, then sintering the pattern, and finally filling the voids 8a formed during the sintering with the conductor by plating, the pattern can be fattened up to the required film thickness, and the wiring that has varying line widths and film thickness can be easily formed.

The circuit board related to the present invention which has the wiring conductor 8 of such configuration partly or wholly as the wiring, the wiring resistance is remarkably small as compared to the configuration with voids 8a not filled with the conductor 11. In particular, when the circuit is used with a high-frequency power supply connected, leaving the voids 8a as voids may accentuate increased resistance by the skin effect but in the circuit board related to the present invention in which void filling is carried out, the circuit board is free of such resistance increase and stable electric continuity can be secured.

In addition, by filling voids 8a with conductor without leaving them as voids as they are, no crack is generated, even when the force to generate deformation is exerted to the wiring portion, such as heat stress, bend stress, dropping impact and others, and the voids 8a are difficult to result in damage such as wiring breakage and others. However, when voids 8a are left as voids as they are without filling with conductor, stress is concentrated to such voids and cracks are generated, and wiring breaking is likely to occur.

The present invention can be effectively utilized in the field of printed circuit boards. To be more specific, the present invention can be effectively utilized for the electrically conductive material used for forming wiring in printed circuit boards, a method for fabricating conductor patterns using the electrically conductive material, a method for fabricating circuit boards with the conductor patterns used as circuits, and fields of conductor patterns, and the circuit boards, and others.

While we have shown and described several embodiments in accordance with the present invention, it is understood that the same is not limited thereto but is susceptible of numerous changes and modifications as known to those skilled in the art, and we therefore do not wish to be limited to the details shown and described herein but intend to cover all such changes and modifications as are encompassed by the scope of the appended claims.

What is claimed is:

1. A circuit board, comprising:
    a substrate; and
    a wiring conductor provided on the substrate, the wiring conductor comprising a sintered structure comprising metal particles of 0.5-10 µm average particle sizes bonded to each other through the intermediary of superfine metal nanoparticles having an average particle size of 1-10 nm, and conducting metal provided in voids in the sintered structure by a plating treatment for filling voids between the metal particles and the superfine metal nanoparticles.

2. The circuit board according to claim 1,
    wherein the sintered structure is formed by sintering wiring patterns formed by using a compound for forming wiring conductor containing (a) superfine metal nanoparticles whose average particle size is 1 through 10 nm; (b) an organic coating compound coated on the surface of the superfine metal particle in the film thickness of 1 through 10 nm; (c) a latent reactive organic compound that reacts with the organic coating compound in the range from 100 to 250° C.; (d) metal particles whose average particle size is 0.5 through 10 µm; and (e) dispersion medium that stably disperses components (a) through (d).

3. The circuit board according to claim 2,
    wherein the plating treatment for filling voids between the metal particles and the metal nanoparticles is conducted after forming the sintered structure.

4. The circuit board according to claim 1,
wherein the wiring conductor consists essentially of the sintered structure and the conducting metal provided in the voids in the sintered structure.

5. The circuit board according to claim 1, wherein the superfine metal nanoparticles comprise a material selected from the group consisting of gold, silver, copper, platinum, palladium, tin, lead and nickel.

6. The circuit board according to claim 5, wherein the metal particles of 0.5-10 μm average particle sizes comprise copper.

7. The circuit board according to claim 1, wherein the metal particles of 0.5-10 μm average particle sizes comprise copper.

8. The circuit board according to claim 1, wherein the superfine metal nanoparticles comprise a material selected from the group consisting of gold, silver, platinum and palladium.

9. The circuit board according to claim 8, wherein the metal particles of 0.5-10 μm average particle sizes comprise copper.

* * * * *